(12) United States Patent
Kadambi et al.

(10) Patent No.: US 7,109,932 B2
(45) Date of Patent: Sep. 19, 2006

(54) ANTENNA EFFICIENCY TEST DEVICE

(75) Inventors: Govind R. Kadambi, Melbourne, FL (US); Ram M. Narayanan, State College, PA (US); Yeqin Huang, Harvey, LA (US); Gordon Evert, Lincoln, NE (US); James Blake Winter, Lincoln, NE (US)

(73) Assignee: Centurion Wireless Technologies, Inc., Lincoln, NE (US)

( * ) Notice: Subject to any disclaimer, the term of this patent is extended or adjusted under 35 U.S.C. 154(b) by 116 days.

(21) Appl. No.: 10/871,432

(22) Filed: Jun. 18, 2004

(65) Prior Publication Data
US 2005/0280591 A1    Dec. 22, 2005

(51) Int. Cl.
*G01R 29/10* (2006.01)
*H04B 17/00* (2006.01)

(52) U.S. Cl. ............... 343/703; 455/67.12; 702/57; 702/182

(58) Field of Classification Search ............ 343/703; 455/67.11, 67.12; 702/57, 182
See application file for complete search history.

(56) References Cited

U.S. PATENT DOCUMENTS

| 5,532,704 | A * | 7/1996 | Ruelle ................. 343/703 |
| 6,329,953 | B1 * | 12/2001 | McKivergan ............ 343/703 |
| 6,448,787 | B1 * | 9/2002 | Oglesby ................ 324/612 |
| 6,795,030 | B1 * | 9/2004 | Klingler et al. ......... 343/703 |
| 2002/0160717 | A1 * | 10/2002 | Persson et al. .......... 455/67.1 |
| 2004/0155824 | A1 * | 8/2004 | Nagashima ............. 343/703 |

FOREIGN PATENT DOCUMENTS

JP            06160450 A    *    6/1994

* cited by examiner

*Primary Examiner*—Tan Ho
*Assistant Examiner*—Leith A. Al-Nazer
(74) *Attorney, Agent, or Firm*—Holland & Hart LLP

(57) ABSTRACT

The present invention provides, an antenna test device to test antenna efficiency. The test device includes a cavity formed by at least one conductive sidewall. The cavity contains at least one tuning probe, at least one movable portion, or a combination thereof. The tuning probes and/or movable portion help inhibit the antenna under test from having faulty measurements due to anti resonance or coupling.

27 Claims, 8 Drawing Sheets

ANTENNA EFFICIENCY TEST DEVICE

RELATED APPLICATIONS

This application is related to copending application Ser. No. 10/871,207 filed concurrently herein.

FIELD OF THE INVENTION

The present invention relates to antenna testing devices and, more particularly, to a cavity test device capable of measuring antenna efficiency.

BACKGROUND OF THE INVENTION

One important performance attribute of an antenna is the antenna's radiation efficiency. One way to define or identify an antenna's radiation efficiency is as a ratio of the power radiated from the antenna to the power input to the antenna. The ratio indicates losses in the antenna system. Formula (1), below, defines radiation efficiency η of an antenna as:

$$\eta = \frac{P_R}{P_R + P_L} \quad (1)$$

where $P_R$ is the radiated power, and $P_L$ is the power loss of the antenna. The quantity $P_R+P_L$ is the power input to the antenna. Because power input to the antenna is known, and power radiated from the antenna is measurable, power loss is derivable.

An equivalent definition of efficiency is through a ratio of radiation resistance and loss resistance. In this case, formula (2) measures antenna efficiency η as:

$$\eta = \frac{R_R}{R_R + R_L} \quad (2)$$

where $R_R$ is the radiation resistance, and $R_L$ the loss resistance. The quantity $R_R+R_L$ is the input resistance of the antenna and it constitutes the real part of the antenna input impedance.

As is commonly understood in the art, the radiation resistance of an antenna is equivalent to the resistance of an equivalent ideal resistor which when replaced would deliver the same power as that of the antenna.

Conventionally, a 3D-Pattern Integration Method is used to determine the radiation efficiency of the antenna. The 3D-Pattern Integration Method of efficiency measurement is based on power, see formula (1), and involves measuring the radiation pattern over a sphere that encloses the test antenna.

While the conventional and accepted method of determining radiation efficiency, the 3D-Pattern Integration Method has several drawbacks. Some of the drawbacks are that the test is relatively expensive and time consuming. The 3D-Pattern Integration Method computes the efficiency of the antenna based on the gain computations, which in turn are determined through volumetric or 3D patterns of the test antenna.

An alternative to the 3D-Pattern Integration Method above involves a process conventionally known as the Cavity Method of Efficiency. The Cavity Method of Efficiency is also known as the Wheeler Method. This method originally proposed by Wheeler [H. A. Wheeler, "The Radiansphere around a Small Antenna", Proceedings of the IRE, August, 1959, pp. 1325–1331] enables the determination of the antenna efficiency defined in terms of radiation and loss resistance, see formula (2) above. The Cavity Method of Efficiency assumes radiation resistance gets shorted when an antenna under test is enclosed by a conducting cavity. In other words, the antenna will not radiate when a conducting cavity encompasses, bounds, or shields the antenna. Under this assumption, the input resistance of the test antenna placed inside a shielded cavity is a direct measure of the loss resistance of the antenna. Thus by making two impedance measurements of the test antenna, one when the test antenna is in free space (to measure $R_R+R_L$) and the other when the test antenna is inside the shielded cavity (to measure $R_L$), the radiation resistance $R_R$ can be determined because $R_R=(R_R+R_L)-R_L$. Once the radiation resistance $R_R$ and the loss resistance $R_L$ of the antenna are known, one can determine the antenna efficiency using formula (2).

When compared to the 3D-Pattern Integration Method, the Cavity Method of Efficiency is considered simpler, less time consuming and less tedious. However, it has its own drawbacks despite all these novel features. In particular, the Cavity Method of Efficiency has constraints on the bandwidth of the measurement. This means, depending upon the size of the cavity or shielding, the antenna may encounter an anti resonance of the cavity.

The term anti resonance defines that resonant frequency of the cavity which overlaps the measurement frequency of the test antenna. The measurement cavity has inherent different resonant frequencies depending upon the dimensions of the cavity.

The anti resonance of the cavity results in the measurement of loss resistance $R_L$ whose magnitude is higher or much higher than the input resistance $(R_R+R_L)$ of the test antenna in free space. This in turn leads to a case of negative radiation resistance $R_R$ and therefore negative efficiency of the antenna. Both the negative radiation resistance $R_R$ and negative efficiency η of the antenna are unrealistic and defy the physical significance or meaning of the underlying antenna parameters.

In the past, the only recourse to overcome the anti resonance of the cavity was to use cavities of different sizes for different test antennas. Even for the same test antenna, there may be need to use separate cavities of varying sizes for different frequency bands of interest. The above-cited limitations have restricted the practical utility of Cavity Method of Efficiency. Thus, it would be desirous to develop a cavity that addressed the drawbacks of the existing Cavity Method of Efficiency.

SUMMARY OF THE INVENTION

To attain the advantages and in accordance with the purpose of the invention, as embodied and broadly described herein, a antenna test cavity is provided. The test cavity includes a sidewall that defines a volumetric space. At least one conductive tuning probe resides on the sidewall and extends into the volumetric space and a feed.

The present invention also provides a test cavity where the volumetric space is variable in size. In this embodiment, at least one movable surface is provided to change the volume of the volumetric space.

The foregoing and other features, utilities and advantages of the invention will be apparent from the following more particular description of a preferred embodiment of the invention as illustrated in the accompanying drawings.

BRIEF DESCRIPTION OF THE DRAWING

The accompanying drawings, which are incorporated in and constitute a part of this specification, illustrate embodiments of the present invention, and together with the description, serve to explain the principles thereof. Like items in the drawings are referred to using the same numerical reference.

DETAILED DESCRIPTION

This invention provides, among other things, a test cavity usable for the Cavity Method of Efficiency. This test cavity enhances the scope of applicability of Cavity Method of Efficiency and improves the accuracy of the measurement. Further, the test cavity increases the bandwidth of the measurement range. This invention also proposes and demonstrates that it is possible to use the test cavity to carry out the measurement with different types of antennas across many frequency bands of interest. One particular and significant improvement of the test cavity of the present invention involves avoidance of the anti resonance and associated negative values of efficiency that result from attempting to take measurements in the anti resonance bandwidth. As will be described, this technical advantage is achieved by the novel test cavity of the present invention in part by minimizing the coupling between the test antenna and the measurement cavity.

Figure 1:
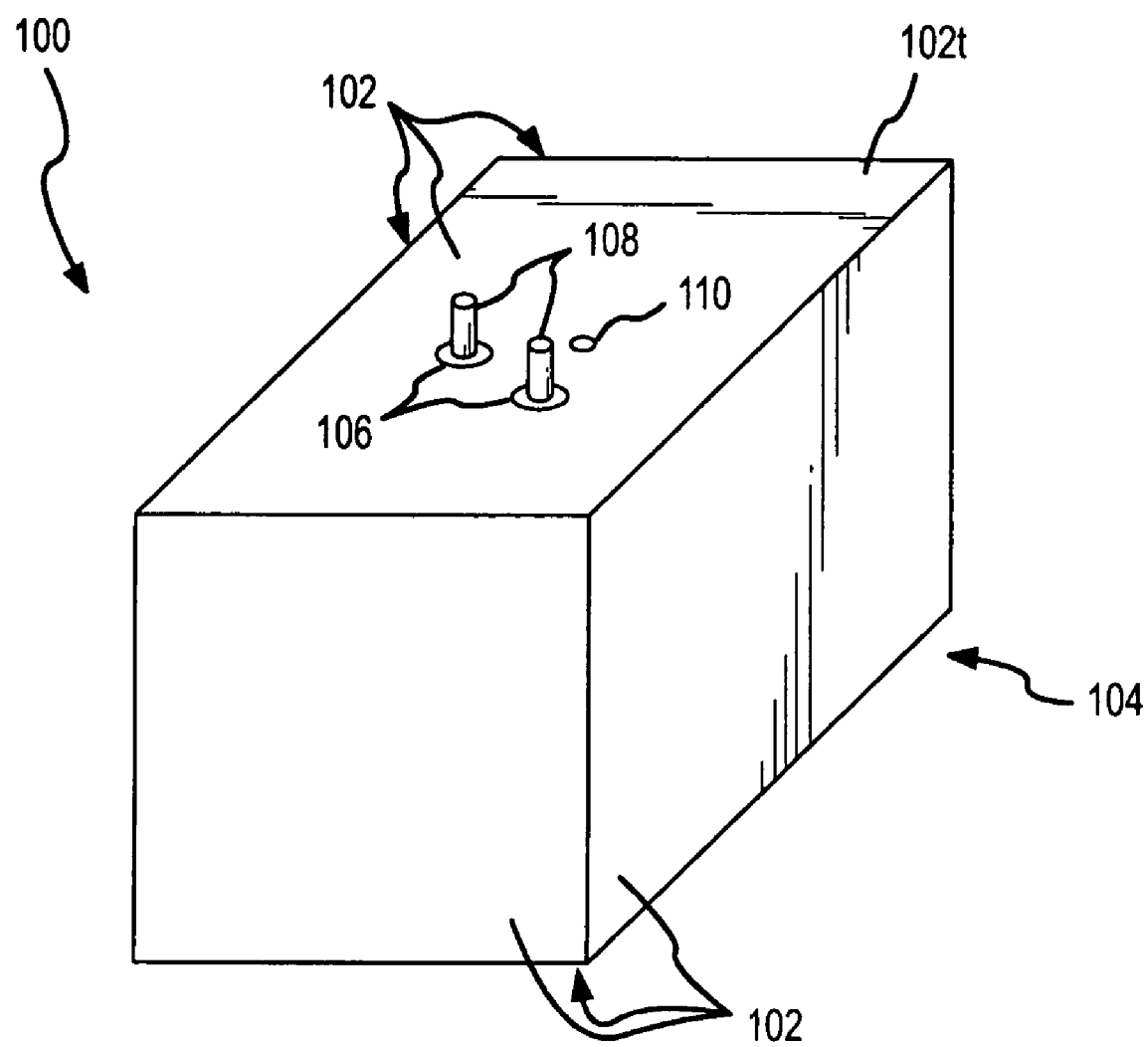
FIG. 1 is a perspective view of a test cavity constructed in accordance with the present invention.
Figure 2:
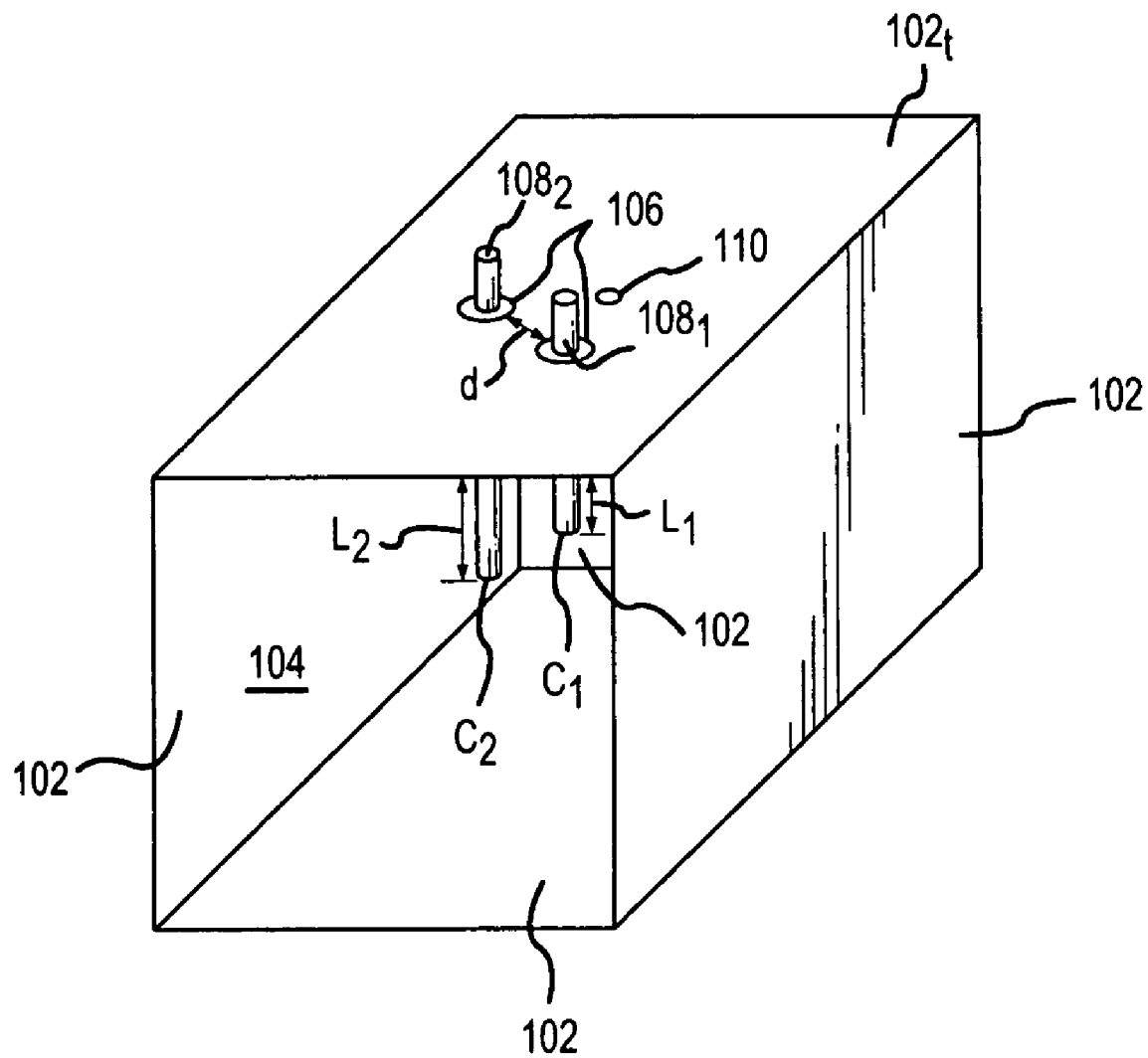
FIG. 2 is a perspective view of the test cavity of FIG. 1 with a side removed to view the interior of the cavity.

The present invention will be described with reference to FIGS. 1–6. Referring first to FIG. 1, a test cavity 100 is shown. As shown, test cavity 100 is cubic in shape having six generally equal sides 102 surrounding a volumetric space 104 (see FIG. 2). Sides 102 may be referred to as a front side, a back side, a left side, a right side, a top side and a bottom side, but the designations are relative in nature. The sides 102 are fixed, so volumetric space 104 is similarly fixed in size. While shown as a cube, test cavity 100 could have other geometric, irregular, or random shapes. While a cubic test cavity 100 has been shown to be satisfactory, it is believed a spherical, cylindrical, or conical shape test cavity would be equally useful. One of the sides 102, in this case topside 102t, contains one or more ports 106 to accommodate one or more tuning probes 108. FIG. 2 shows two ports 106 and two tuning probes $108_1$ and $108_2$ but more or less could be used as desired. Further, the tuning probes $108_1$, and $108_2$ each have a cross-sectional area $c_1$ and $c_2$ and extend a length $L_1$ and $L_2$ into space 104, respectively (see FIG. 2). While the cross-sectional areas and the lengths of the two probes 108 are shown as different, they could be identical. While shown as cylindrical probes, the probes could have numerous cross-sections, such as, polygonal, elliptical, oval, triangular, irregular, or the like. Also, ports 106 and probes 108 are shown as residing on topside 102t. Ports 106 and probes 108 could reside on multiple sides of test cavity 100. Located on one or the other sides 102 is a power port 110. Power port 110 is generally located on the same side as port 106 but could be located on the side opposite port 106. In this example, power port 110 is located generally at the center of side 102t equidistant from ports 106, but other locations are equally possible. Further, the test antenna (not shown) would be removably coupled to power port 110 when being tested. Thus, side 102t should be removable to facilitate insertion of the test antenna.

Referring now to FIG. 2, test cavity 100 is shown with one of the sides 102 removed showing volumetric space 104. Probes 108 extend into volumetric space 104. In this embodiment, tuning probes 108 provide a way to tune the resonant frequency of test cavity 100. Tuning test cavity 100 provides a means to avoid the anti resonance phenomenon. Tuning probes 108 can be arranged orthogonally to assist in operation, but can be arranged other than orthogonally as well.

Turning probes 108 are means to avoid the anti resonance phenomenon in cavity measurement but it has been discovered that the Cavity Method of Efficiency has another drawback also. In particular, the antenna under test couples to test cavity 100 causing erroneous results. This coupling seems to occur at or around the anti resonance bandwidth. Tuning probes 108 also assist in minimizing the coupling between the antenna (not shown) and test cavity 100.

Using the Cavity Method of Efficiency to accurately measure efficiency requires removal of the anti resonance phenomenon and the inhibition of coupling between the test antenna and test cavity 100. Tuning probes 108 minimize both effects.

As shown in FIGS. 1 and 2, each tuning probe 108 extends a length 1 into test cavity 104. Further, tuning probes 108 have a cross-sectional area c. A distance d separates tuning probes 108. Altering one or more of lengths 1, cross sectional areas c or distance d, as well as the placement of power port 110 provides a means to control or vary the resonant frequency of test cavity 100.

Figure 3:
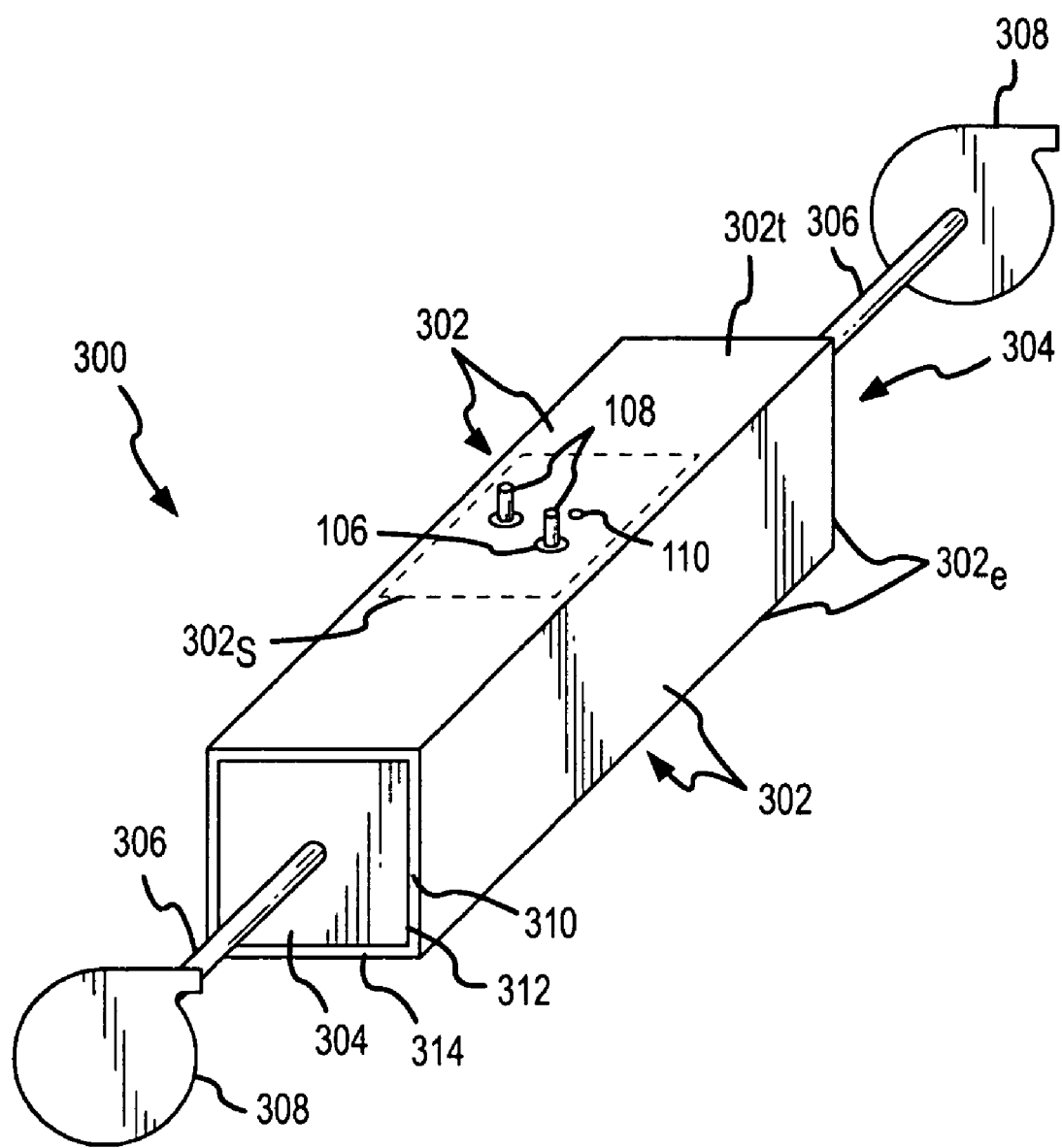
FIG. 3 is a perspective view of another embodiment of a test cavity constructed in accordance with the present invention.

Referring now to FIG. 3, a test cavity 300 is shown. Test cavity 300 as shown has four generally equal elongated sides 302 and two generally square sides 304. Of course, as explained above, test cavity 300 could be, for example, cylindrical in shape. In this case, instead of four elongated sides 302, cavity 300 would have a single curved elongated side. Also, generally square side 304 would be circular. Other shapes are, of course, possible. Further, as shown, test cavity has sharp edges 302e where sides 302 and 304 abut. These edges 302e could be beveled as desired. One side 302t (or a removable section of side 302t, which is shown in phantom as 302s) of test cavity 300 could have ports 106, tuning probes 108, and power feed 110 similar to test cavity 100 above, which operate as explained above and will not be re-explained herein. Ports 106, probes 108, and power feed 110 could be located on removable portion 302s on side 302t.

Sides 304 are movably coupled to sides 302 using, for example, an arm 306 such that the relative position of sides 304 can be varied by sliding the sides using arm 306. While both sides 304 are shown as slidably coupled to sides 302, only one side needs to move or both the sides can move. If only one side 304 is slidably coupled, portion 302s should be movably coupled as well such that the test antenna remains approximate the center of the test cavity space.

Positioning of sides 304 could be by manual placement or movement of arms 306 or automatic by a motor 308, servo or the like.

Being able to vary the volume of the test cavity through movably coupled side 304 facilitates the resonant tuning of the cavity. Further, varying the volume facilitates the very wide bandwidth of the measurement range without encountering the negative efficiency either via the anti resonance or coupling. In addition to the dual tuning probes 108, cavity 300 includes at least one movable side 304 to vary the volume of the cavity. The moving walls of the cavity should be on either sides of the feed/input point of the cavity, such that the tuning probes and power port remain relatively equidistant from each side. However, the tuning probes and power port do not need to remain equidistant, for example, if only one side 304 is movable. Although, as explained above, it would be possible to have a single moving side with moving tuning probes/power ports.

As shown, the walls 304 are designed to increase or decrease the length of the cavity thereby altering the volume of the cavity. With the changes in the positions of the sliding walls, the resonant frequencies of the cavity can be varied to avoid the cavity anti resonance within the measurement range. The placement of the anti resonance outside the operating frequency band also minimizes the antenna-cavity coupling. Because changing the positions of the sliding walls can vary the length of the cavity, the separation between the anti resonance and the operating frequency of the test antenna can also be increased. The larger separation between the anti resonance and the operating frequency also ensures greater suppression of the antenna-cavity coupling thereby resulting in improved accuracy.

To retain the repeatability and the stability of the results of the measurement, at least one conductive gasket 310 is placed around the edge of sides 304 to inhibit RF leakage out of the cavity. It has been found using two gaskets placed in annular grooves 312 about the perimeter 314 of sides 304 works well. Alternatively, gaskets could be placed in sides 302. Gaskets 310 should form an air tight seal between sides 302 and 304. The conductive gasket on the perimeter wall of the sliding wall provides an easy motion of the sliding wall without causing an abrasion on the respective inner walls of the cavity.

Because moving sidewall 304 facilitates rapid changes in the resonant frequency of the cavity, tuning probes 108 are optional in this embodiment.

Figure 4:
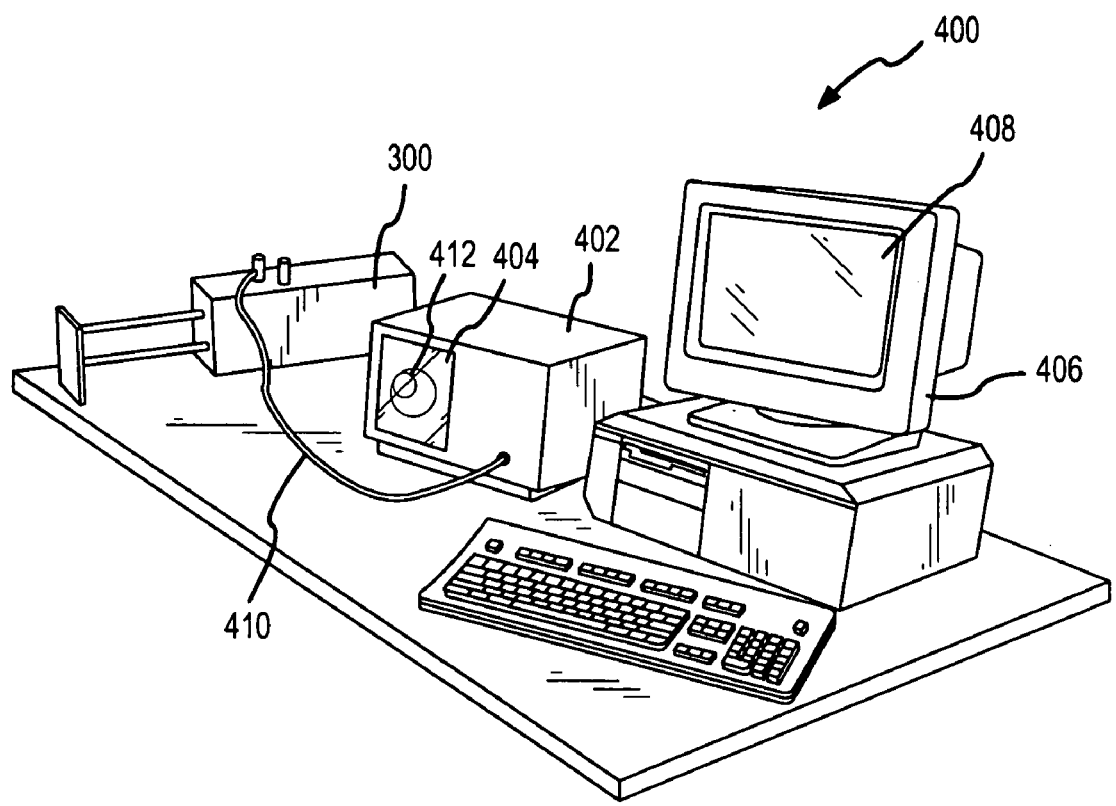
FIG. 4 is a functional diagram of a measurement set up in accordance with an embodiment of the present invention.

Referring to FIG. 4, a measurement set up 400 is shown using test cavity 300. In this case, measurement set up 400 includes an analyzer 402, such as a network analyzer commonly available in the art, having a display 404. Analyzer may be connected to a computer 406 (such as a personal computer or other processors) having a display 408. Measurement set up 400 is coupled to test cavity 300 using a communication link 410. In this example, a cable serves as a RF link but communication link 410 could be a cable, fiber optic, wireless, or the like. In the Cavity Method for Efficiency measurement, the presence of the anti resonance and the minimization of the antenna-cavity coupling can be ascertained through the measured value of the input resistance (loss resistance) of the antenna placed inside a cavity. The measurement set up 400 has a display of polar plot 412 indicating both the measured input resistance as well as the reactance on display 404. On reviewing the plots, whether the test antenna placed inside the measurement cavity is approaching the anti resonance or is already in the anti resonance of the cavity is determined through the measurement of the antenna input resistance $R_i$ (inside the cavity).

As already stated, the measured antenna input resistance $R_i$ (inside the cavity) is the loss resistance of the subject antenna.

Before placement of the antenna into the cavity, the input resistance of the test antenna is measured in free space to get $R_i$ (free space). $R_i$ (free space) is a combination of radiation resistance $R_R$ and loss resistance of the antenna $R_L$.

For a realistic antenna, $(R_R+R_L)>R_L$ and $R_R>>R_L$.

In addition, the radiation resistance of an antenna $R_R$ can never be negative. When $R_L=0$, $\eta=100\%$ $R_R=0$, $\eta=0\%$.

Any sudden and sharp spike in the plot of antenna input resistance $R_i$ (inside the cavity) vs. frequency is an indication of the presence of the anti resonance. If the magnitude of the above spike is greater than the corresponding value of $R_i$ (free space), then it is a confirmation of the presence of the anti resonance as well as the coupling between the cavity and the antenna.

When the test antenna is not in the anti resonance region and if the coupling between the antenna and the cavity is minimal, then antenna input resistance $R_i$ (inside cavity) is always less or far less than the antenna input resistance of the test antenna $R_i$ (free space) implying positive efficiency.

However, if the antenna input resistance $R_i$ (inside cavity) shows a spike or peak at a measurement frequency such that such a peak is greater or far greater in magnitude compared to that of $R_i$ (free space), implies that the test antenna is in anti resonance region and or there exists a strong coupling between the antenna and the cavity. When the calculation $R_R=R_i$ (free space)–$R_i$ (inside cavity) is made to determine the radiation resistance, we get negative value of $R_R$ (and therefore negative efficiency according to formula (2)) implying the measurement frequency is in the anti resonance region of the cavity. At the anti resonance of the cavity, the antenna input resistance $R_i$ (inside cavity) can be 3 or 4 magnitude higher than that of the antenna input resistance $R_i$ (free space).

Figure 5:
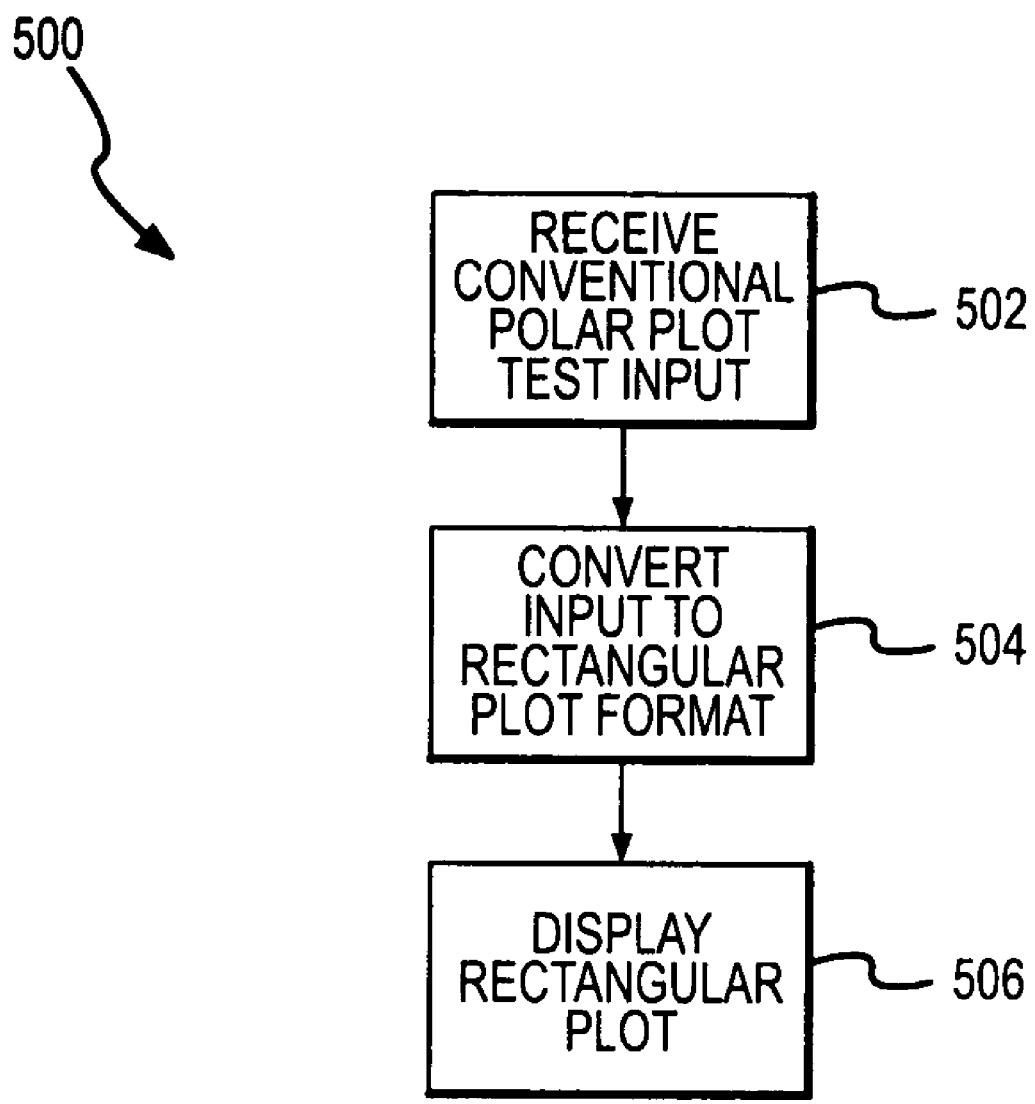
FIG. 5 is a flowchart illustrative of a conversion consistent with the present invention.
Figure 6:
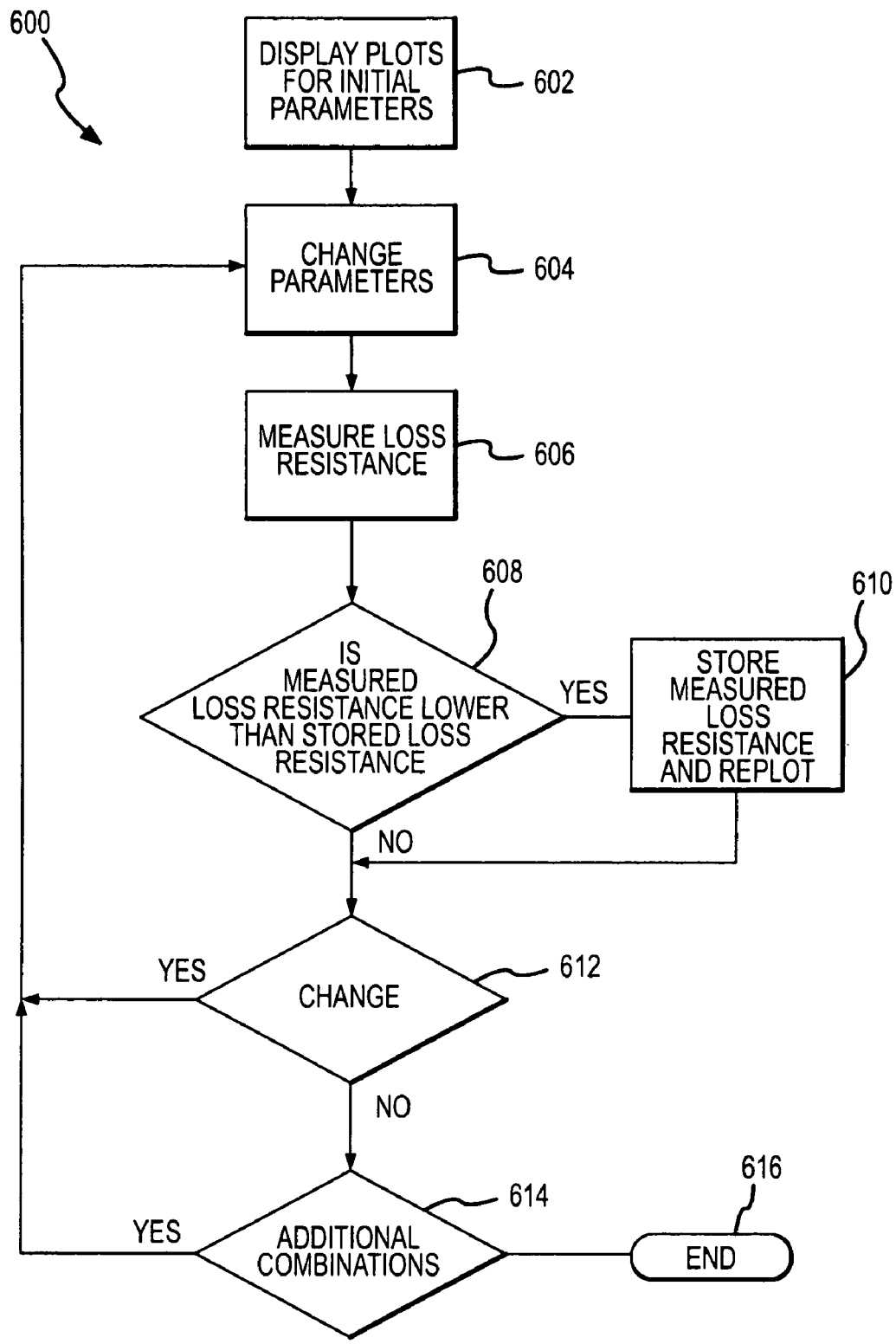
FIG. 6 is a flowchart regarding plotting information relating to antenna efficiency consistent with the present invention.
Figure 7:
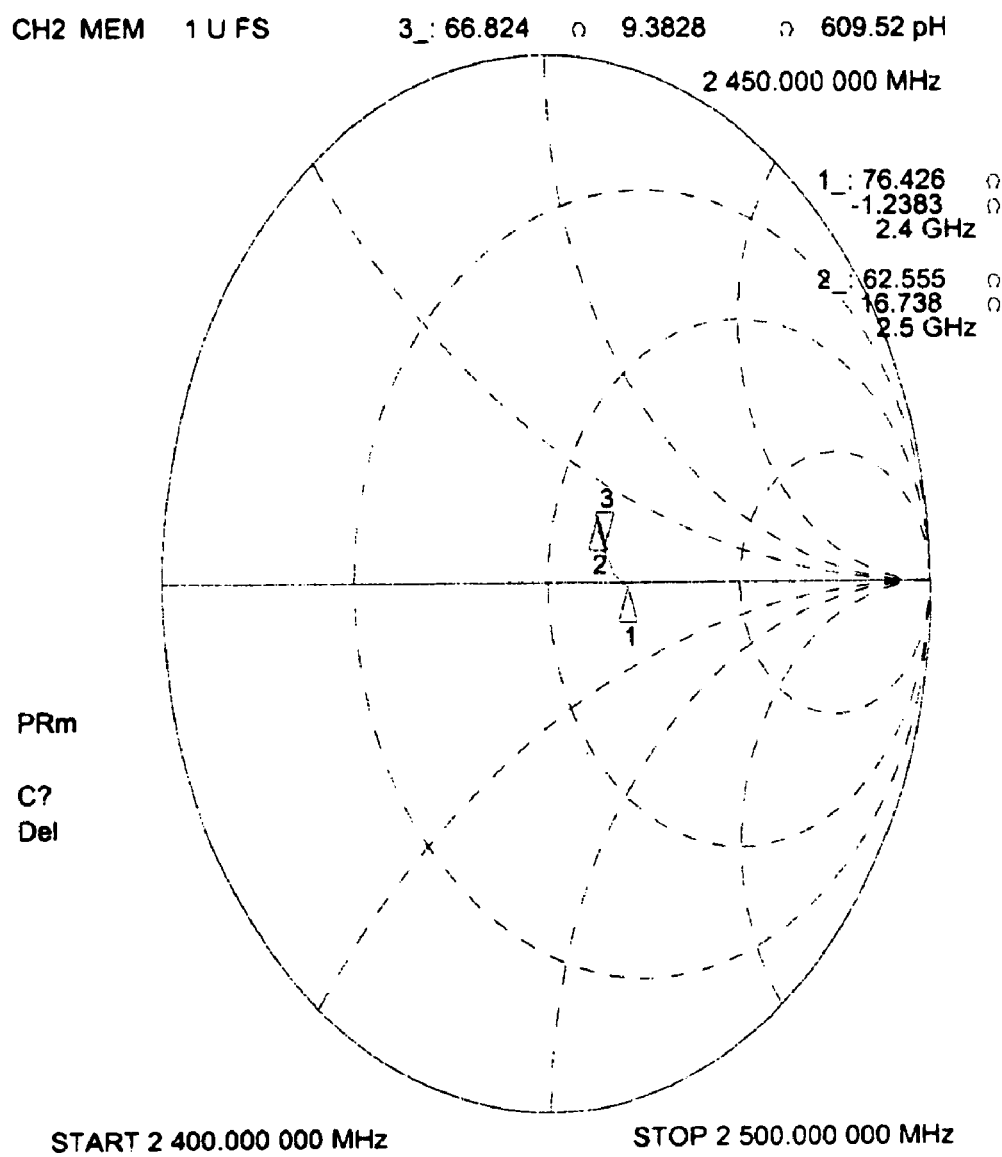
FIG. 7 is a Smith chart of a typical test antenna.
Figure 8:
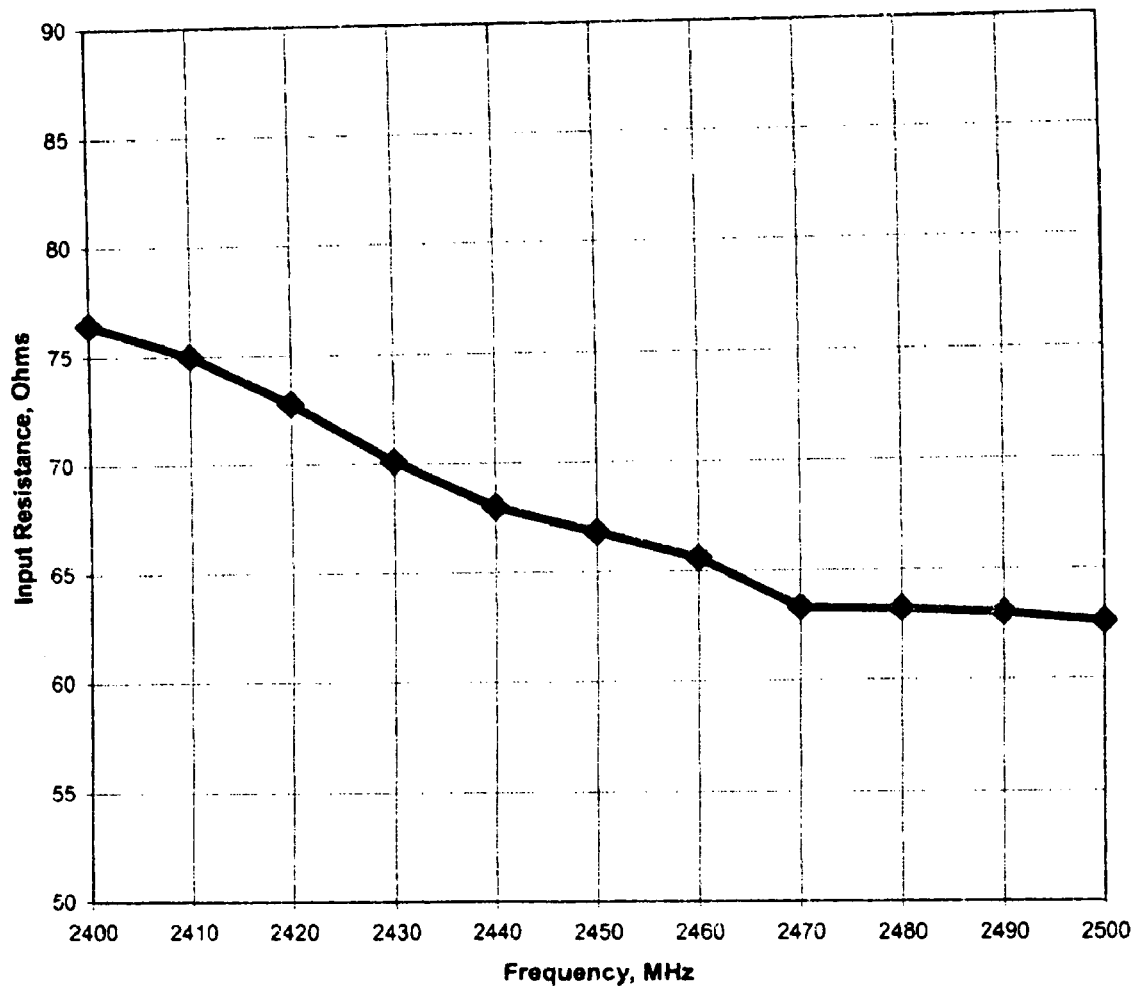
FIG. 8 is a rectangular plot of the input resistance vs. frequency of the same test antenna.

To ensure the desired absence of the anti resonance and the minimization of the antenna-cavity coupling in the operating frequency band, it is more convenient to have a display of rectangular plot with the two axes representing the frequency and the measured input resistance only. Referring to FIG. 5, a flowchart 500 shows a method by which the processor of measurement set up 400 may convert polar plot 412 a rectangular plot displayable on display 408 of computer 406, for example. First, the processor receives conventional polar plot input from test cavity 300, step 502. The polar plot input includes the real and imaginary components of the reflection coefficient. The processor converts the polar plot inputs to rectangular plot inputs that displays resistance vs. Frequency.], step 504. The conversion algorithm is generally known in the art and will not be further explained herein. Finally, the rectangular plot is displayed, step 506, on, for example, processor display 408. A typical Smith chart (Polar Plot) of an antenna and a desirable rectangular plot showing the input resistance vs. Frequency of the same antenna are shown in FIGS. 7 and 8, respectively. FIGS. 7 and 8 are only for the purpose of illustration and should not be considered limiting.

One factor that makes the display unique is the ability to observe changes in the resistance that occur because of the cavity losses. The display shows the resistance vs. frequency at the present moment and may display the minimum resistance vs. frequency—in a different color—since the measurement interval began. The operator then changes the cavity dimensions as well as other tuning parameters to move the cavity loss peaks (loss resistance peaks) out of measurement frequency band. Changes in the minimum resistance of the test antenna are updated. The operator is confident the adjustments are complete when the minimum resistance display ceases to change.

Once displayed, the rectangular plot on the monitor indicates the instantaneous values of the measured input resistance of the test antenna for that particular instant combination of the positions of the two sliding walls as well as the depth and positions of the two tuning probes. For a particular frequency, the measurement of the input resistance (loss resistance) of the antenna placed inside a cavity under the realizable condition of zero antenna-cavity coupling (ideal case) or non zero and yet maximally reduced antenna-cavity coupling (near ideal case) is indicated by the attainable lowest value of the input resistance (loss resistance) through any combination of variations involving the positions of the two sliding walls as well as the positions, size and the inserted depth of the tuning probes.

The Cavity Method of Efficiency uses the minimum cavity size so as to not to disturb the near fields of the test antenna. In the design, care should be taken to see that even when the two sliding walls of the cavity are in the closest positions with respect to each other, the size of the cavity is large enough to satisfy the minimum cavity size requirement. Once this criterion is met, the minimum attained value of the measured loss resistance with the above mentioned condition of either ideal or near ideal condition of maximally reduced antenna-cavity coupling could be relied upon to determine the efficiency of the antenna.

When the efficiency measurement over a relatively wider frequency band is of interest, it is possible that one particular combination of tuning parameters involving the positions of the sliding walls and the tuning probes may not lead to the ideal or near ideal condition of zero or maximally reduced antenna cavity coupling across the entire frequency band of interest. Under such a scenario, there may be a need to arrive at separate and different combination of tuning parameters to realize the required near ideal condition of maximally reduced antenna cavity coupling for individual frequencies. However for ease of experiment over a frequency band, it is desirable to view and retain a plot of measured lowest possible loss resistance at each individual frequency of the desired band arrived after trying all possible permutations and combinations of the tuning parameters. Such a methodology is shown by flowchart 600 (see FIG. 6). First, the processor displays two plots, step 602. The first plot is instantaneous value of measured loss resistance at individual frequencies for that instant combination of tuning parameters. The other (or second) plot is termed the minimum loss resistance curve, which shows the lowest value of the loss resistance at the individual frequencies measured during the elapsed measurement period including all the previous iterations. Initially, the plots are developed using a predetermined combination of tuning parameters, which will be largely dictated by the antenna being tested and the cavity parameters. Initially, the plots coincide with each other. Next, the tuning parameters are changed, step 604. In particular, the variable tuning parameters may be changed by the positions of the sliding walls, the positions as well as depth of the tuning probes inside the cavity, or the like. While all the parameters can be changed simultaneously, generally only one parameter is varied at a time so that optimization of that parameter can be fully carried out in a straight forward manner.

The positions of the each of the sliding walls 304 may be varied separately. The movement of a sliding wall in a particular direction is continued if there is a steady and continuous decrease in the magnitude of the loss resistance curve with respect to any frequency within a specified band. This is continued until the limiting positions of that particular sliding wall is reached. Then the above procedure is repeated with the other sliding wall. With these positions of the sliding walls, the positions and the depth of insertion of a tuning probe are varied to get the minimization of the loss resistance curve across the frequency band. The same sequence is repeated with the other tuning probe. In a further refinement of the procedure, the positions of the movable sliding walls can be incrementally and discretely varied and at each of these incrementally varied positions, the positions as well as depth of insertion of the tuning probes can be altered to achieve the minimum loss resistance of the test antenna across the band. Once that instant combination is changed, the measured loss resistance at individual frequencies is measured, step 606. Next, the processor compares the instantaneous (new) value of the measured loss resistance with the previous lowest value of the loss resistance for each individual frequency, step 608. If the instant measured loss resistance at a particular frequency is lower than the previously lowest loss resistance, then the data of the minimum loss resistance curve (plot) will be updated and displayed with the updated data and the new minimum is stored for further comparison, step 610. Next, the processor determines whether there is noticeable or significant change in the minimum loss resistance, step 612. If there is noticeable or significant change, the system determines whether further combinations of tuning parameters exists, step 614. If there is no noticeable or significant change or there are no further combinations, then the process ceases, step 616. The minimum loss resistance curve at the end of the experiment yields the measured loss resistance data of the antenna across the frequency band of interest.

While the invention has been particularly shown and described with reference to an embodiment thereof, it will be understood by those skilled in the art that various other changes in the form and details may be made without departing from the spirit and scope of the invention.

We claim:

1. An antenna test device, comprising:
 a conductive test cavity having at least one movable sidewall defining and enclosing a variable volumetric space;
 at least one tuning probe port residing on the at least one sidewall;
 at least one conductive tuning probe, the at least one conductive tuning probe coupled to the at least one tuning probe port such that the at least one conductive tuning probe extends into the volumetric space; and
 a feed port.

2. The antenna test device according to claim 1, wherein the at least one tuning probe port comprises a plurality of tuning probe ports and the at least one tuning probe comprises a plurality of tuning probes such that each of the plurality of tuning probes is coupled to a corresponding one of the plurality of tuning probe ports.

3. The antenna test device according to claim 2, wherein the plurality of tuning probe ports is greater than the plurality of tuning probes.

4. The antenna test device according to claim 2, wherein the plurality of tuning probes extend a plurality of lengths into the volumetric space.

5. The antenna test device according to claim 4, wherein the plurality of tuning probes have a plurality of widths.

6. The antenna test device according to claim 1, wherein the at least one tuning probe port comprise two tuning probe ports and the at least one tuning probe comprises two tuning probes and the two tuning probe ports are oriented such that when the two tuning probes are coupled to the two tuning probe ports, the tuning probes are orthogonal.

7. The antenna test device according to claim 1, wherein the test cavity is cubic and the at least one sidewall comprises a plurality of sidewalls.

8. The antenna test device according to claim 7, wherein the plurality of sidewalls comprises a front side, a back side generally opposite the front side, a left side connecting the front side and back side, a right side generally opposite the left side, a top side connecting the front side and back side, and the right side and left side, and a bottom side generally opposite the top side.

9. The antenna test device according to claim 8, wherein the at least one tuning probe port resides in the top side.

10. The antenna test device according to claim 9, wherein the right side and left side move relative to each other such that the volumetric space can change.

11. The antenna test device according to claim 10, further comprising a plurality of gaskets, such that at least one gasket is positioned about a perimeter of the right side and a perimeter of the left side.

12. The antenna test device according to claim 11, further comprising a first groove along the perimeter of the right side and a second groove along the perimeter of the right side such that the at least one gasket positioned about the perimeter of the right side resides in the first groove and the at least one gasket positioned about the perimeter of the right side resides in the second groove, the first and second grooves on the perimeter of said right side of the antenna test device are parallel and in close proximity.

13. The antenna test device according to claim 11 further comprising a first groove along the perimeter of the left side and a second groove along the perimeter of the left side such that at least one gasket positioned about the perimeter of the left side resides in the first groove and at least one gasket positioned about the perimeter of the left side resides in the second groove, the first and second grooves on the perimeter of said left side of the antenna test device are parallel and in close proximity.

14. The antenna test device according to claim 1, wherein the volumetric space is fixed in size.

15. An antenna test device, comprising:
a first side;
a second fixed side opposite the first side;
a third side extending from the first side to the second side;
a fourth side opposite the third side and extending from the first side to the second side, such that the first side, the second side, the third side, and the fourth side define a generally cubic space having a first opening and a second opening opposite the first opening;
a fifth side residing in the first opening;
a sixth side residing in the second opening;
at least one of the fifth side and the sixth side movable relative to the first side, the second side, the third side, and the fourth side, such that the volume defined by the first side, the second side, the third side, the fourth side, the fifth side, and the sixth side is changeable;
at least one tuning probe port residing on at least one of the first side, the second side, the third side, and the fourth side;
at least one tuning probe coupled to the at least one tuning probe port and extending into the cubic space; and
a feed port.

16. The test device according to claim 15, wherein both the fifth side and the six side are movable.

17. The test device according to claim 16, further comprising a side portion removably coupled to at least one of the first side, the second side, the third side, and the fourth side and wherein the at least one tuning probe port further resides on the side portion.

18. The test device according to claim 16, wherein the at least one tuning probe extends into the cubic space approximately equidistance from the fifth side and the six side.

19. The test device according to claim 16, wherein the at least one tuning probe extends into the cubic space a non equidistance from the fifth side and the six side.

20. The test device according to claim 16, further comprising:
a first movement arm attached to the fifth side; and
a second movement arm attached to the sixth side, whereby the first movement arm controls the placement of the fifth side and the second movement arm controls the placement of the sixth side.

21. The antenna according to claim 16, further comprising a plurality of gaskets, such that at least one gasket is positioned about a perimeter of the fifth side and at least one gasket is positioned about a perimeter of the sixth side.

22. The antenna test device according to claim 16, further comprising a first groove along the perimeter of the fifth side and a second groove along the perimeter of the sixth side such that at least a first gasket positioned about the perimeter of the fifth side resides in the first groove and at least a second gasket positioned about the perimeter of the sixth side resides in the second groove.

23. The antenna test device according to claim 22, further comprising at least a third groove along the perimeter of the fifth side and at least a fourth groove along the perimeter of the sixth side, such that the first groove and third groove are parallel and in close proximity and the second groove and the fourth groove are parallel and in close proximity.

24. The test device according to claim 16, further comprising:
at least one motor, wherein the at least one motor causes the first movement arm and the second movement arm to move.

25. An antenna test device, comprising:
a conductive test cavity having at least one sidewall defining and enclosing a volumetric space;
the at least one sidewall comprising at least one movable portion; and
the at least one movable portion of the at least one sidewall being positionable to vary the volumetric space defined and enclosed by the sidewall.

26. The antenna test device according to claim 25, further comprising at least one tuning probe port residing on the at least one sidewall and at least one tuning probe coupled to the at least one tuning probe port and extending in the volumetric space.

27. The antenna test device according to claim 26, wherein the at least one tuning probe port resides on the at least one movable portion.

* * * * *